United States Patent
Kaneko et al.

(10) Patent No.: US 7,486,713 B2
(45) Date of Patent: Feb. 3, 2009

(54) SURFACE-EMITTING TYPE SEMICONDUCTOR LASER AND METHOD FOR MANUFACTURING THE SAME

(75) Inventors: Tsuyoshi Kaneko, Shimosuwa-machi (JP); Tsugio Ide, Suwa (JP); Hitoshi Nakayama, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 45 days.

(21) Appl. No.: 10/934,450

(22) Filed: Sep. 7, 2004

(65) Prior Publication Data

US 2005/0083981 A1    Apr. 21, 2005

(30) Foreign Application Priority Data

Sep. 11, 2003    (JP)    ............... 2003-320038

(51) Int. Cl.
  *H01S 5/00*    (2006.01)
(52) U.S. Cl. ............... 372/50.124; 372/45.01; 372/46.01; 372/46.013; 372/50.11
(58) Field of Classification Search ............ 372/45.01, 372/46.01, 46.013, 50.11, 50.124
See application file for complete search history.

(56) References Cited

U.S. PATENT DOCUMENTS

| | | | | |
|---|---|---|---|---|
| 5,331,654 | A | * | 7/1994 | Jewell et al. ............. 372/45.01 |
| 5,568,499 | A | * | 10/1996 | Lear ......................... 372/45.01 |
| 5,594,751 | A |   | 1/1997 | Scott |
| 5,778,018 | A | * | 7/1998 | Yoshikawa et al. ....... 372/45.01 |
| 5,879,961 | A |   | 3/1999 | Scott |
| 5,903,588 | A | * | 5/1999 | Guenter et al. ......... 372/46.013 |
| 6,134,251 | A |   | 10/2000 | Kawase et al. |
| 6,320,893 | B1 |   | 11/2001 | Ueki |
| 6,603,783 | B1 |   | 8/2003 | Kawase et al. |
| 6,639,931 | B1 |   | 10/2003 | Dowd et al. |
| 2002/0131462 | A1 |   | 9/2002 | Lin et al. |

FOREIGN PATENT DOCUMENTS

| | | |
|---|---|---|
| JP | A 6-224515 | 8/1994 |
| JP | A 8-116130 | 5/1996 |
| JP | A-8-181391 | 7/1996 |
| JP | A 10-27938 | 1/1998 |
| JP | A-10-505465 | 5/1998 |
| JP | A-10-242560 | 9/1998 |
| JP | A-11-054838 | 2/1999 |
| JP | A-11-121867 | 4/1999 |
| JP | A 11-307882 | 11/1999 |
| JP | A-11-354881 | 12/1999 |

(Continued)

OTHER PUBLICATIONS

Choquette, et al., "Fabrication and Performance of Selectively Oxidized . . . ," IEEE Photo. Tech.Lett., V-7 (1995), pp. 1237-1239.*

*Primary Examiner*—Jerome Jackson, Jr.
*Assistant Examiner*—Hrayr A. Sayadian
(74) *Attorney, Agent, or Firm*—Oliff & Berridge, PLC

(57) ABSTRACT

A surface-emitting type semiconductor laser includes a substrate; a first mirror disposed above the substrate; an active layer disposed above the first mirror; a second mirror disposed above the active layer; a first columnar section including the active layer, the first columnar section not having anisotropy; a first dielectric layer disposed in the first columnar section, the first dielectric layer including a symmetric opening section; a second columnar section disposed above the first columnar section, the second columnar section having an outer wall that has anisotropy; and a second dielectric layer disposed in the second columnar section, the second dielectric layer including an asymmetric opening section.

8 Claims, 9 Drawing Sheets

FOREIGN PATENT DOCUMENTS

| | | |
|---|---|---|
| JP | A 2001-156394 | 6/2001 |
| JP | A 2001-156397 | 6/2001 |
| JP | A 2001-244563 | 9/2001 |
| JP | A-2001-525995 | 12/2001 |
| JP | A-2002-208755 | 7/2002 |
| JP | A-2002-299742 | 10/2002 |

* cited by examiner

SURFACE-EMITTING TYPE SEMICONDUCTOR LASER AND METHOD FOR MANUFACTURING THE SAME

The present application claims priority to Japanese Patent Application No. 2003-320038 filed Sep. 11, 2003, which is hereby expressly incorporated by reference herein in its entirety.

BACKGROUND OF THE INVENTION

1. Field of Invention

Exemplary aspects of the present invention relate to a surface-emitting type semiconductor laser and a method for manufacturing the same.

2. Description of Related Art

A surface emitting semiconductor laser is a semiconductor laser which emits laser light in a direction perpendicular to a semiconductor substrate. Surface emitting type semiconductor lasers have excellent characteristics including, for example, easy handling, low threshold currents, etc., compared to related art edge emitting semiconductor lasers. Thus, this technology may be applied to a variety of sensors and light sources for optical communications. However, the control of polarization planes of a surface-emitting type semiconductor laser is difficult because of the symmetry of its planar structure. Therefore, when a surface-emitting type semiconductor laser is used for an optical system with a polarization dependence, instability of polarization planes causes noise. In this respect, a variety of methods to control polarization planes are proposed as follows.

Japanese laid-open patent application HEI 8-116130 and Japanese laid-open patent application HEI 10-27938 disclose methods to control polarization planes by making a planar configuration of a resonator 140 have an anisotropic shape, such as a rectangular shape, an oval shape, or the like. In this case, only specific modes oscillate because its current density distribution is anisotropic. However, according to these methods, the current density distribution is not uniform, and the energy usage efficiency may be lowered.

Japanese laid-open patent application HEI 6-224515 discloses a method to control polarization planes by adding anisotripic strain to an active layer. In this case, anisotropy appears in its gain, such that only specific modes oscillate. However, according to this method, SiN is formed on the side surface of the resonator 140 at different temperatures in order to add anisotripic strain to the active layer, which complicates the process. Furthermore, according to this method, the planar configuration of the resonator 140 is practically limited to a quadrilateral shape to obtain sufficient effectiveness in controlling polarization planes. A circular planar configuration does not demonstrate effectiveness in controlling polarization planes.

Japanese laid-open patent application HEI 11-307882 discloses a method to control polarization planes by providing an oxide layer for current constriction adjacent to an active layer, and an oxide layer for adding stress (in anisotropic configuration) to thereby add large stress to the active layer while maintaining the energy use efficiency. In this case, the oxide layer structure adjacent to the active layer and oxidation process are complicated, and the service life of the device may be adversely affected.

SUMMARY OF THE INVENTION

Exemplary aspects of the present invention provide a highly reliable surface-emitting type semiconductor laser and a method for manufacturing the same, which is capable of controlling polarization planes without lowering the energy usage efficiency.

A surface-emitting type semiconductor laser in accordance with an exemplary aspect of the present invention has a substrate; a first mirror disposed above the substrate; an active layer disposed above the first mirror; a second mirror disposed above the active layer; a first columnar section including the active layer, the first columnar section not having anisotropy; a first dielectric layer disposed in the first columnar section, the first dielectric layer including a symmetric opening section; a second columnar section disposed above the first columnar section, the second columnar section having an outer wall that has anisotropy; and a second dielectric layer disposed in the second columnar section. the second dielectric layer including an asymmetric opening section.

According to the surface-emitting type semiconductor laser, a planar configuration of the second columnar section has anisotropy. Accordingly, anisotropy to confine light can be obtained in the second columnar section. The anisotropy of the planar configuration of the second columnar section makes it possible to control the polarization direction of laser that is emitted.

Also, according to the surface-emitting type semiconductor laser, an electric current flows generally uniformly in the columnar section, particularly in a region adjacent to the active layer. Since almost no offset occurs in the current density distribution in the first columnar section, the energy usage efficiency is high.

Accordingly, by the surface-emitting type semiconductor laser, the polarization direction of laser light can be controlled while maintaining the energy usage efficiency.

In a surface-emitting type semiconductor laser in accordance with an exemplary aspect of the present invention, the first columnar section can have a planar configuration that does not have anisotropy.

In a surface-emitting type semiconductor laser in accordance with an exemplary aspect of the present invention, the second columnar section can have at least one aperture section in a region vertically above the dielectric layer.

In a surface-emitting type semiconductor laser in accordance with an exemplary aspect of the present invention, a planar configuration of the aperture section can have anisotropy.

In a surface-emitting type semiconductor laser in accordance with an exemplary aspect of the present invention, the aperture section can be disposed symmetrically about the opening section of the dielectric layer as being a center.

In a surface-emitting type semiconductor laser in accordance with an exemplary aspect of the present invention, the aperture section can be embedded with a material having a coefficient of thermal expansion different from that of a material composing the second mirror.

In a surface-emitting type semiconductor laser in accordance with an exemplary aspect of the present invention, the second columnar section includes at least an other dielectric layer, the other dielectric layer existing only in a region vertically above the dielectric layer.

In a surface-emitting type semiconductor laser in accordance with an exemplary aspect of the present invention, the other dielectric layer can be formed in a ring shape along a circumference of the second columnar section.

In a surface-emitting type semiconductor laser in accordance with an exemplary aspect of the present invention, the other dielectric layer can be formed around the aperture section.

In a surface-emitting type semiconductor laser in accordance with an exemplary aspect of the present invention, the dielectric layer and the other dielectric layer can be formed by oxidizing AlGaAs layers from side surfaces thereof.

In the surface-emitting type semiconductor laser in accordance with an exemplary aspect of the present invention, a Al composition of the AlGaAs layer to form the dielectric layer can be higher than a Al composition of the AlGaAs layer to form the other dielectric layer.

A method for manufacturing a surface-emitting type semiconductor laser in accordance with an exemplary aspect of the present invention, the surface-emitting type semiconductor laser having a first mirror, an active layer and a second mirror, includes: depositing a semiconductor layer over a substrate; forming a columnar section by etching the semiconductor layer using a first mask layer; forming a first columnar section and a second columnar section having an anisotropic planar configuration above the first columnar section by etching the semiconductor layer and the columnar section using a second mask layer having an anisotropic planar configuration; and forming a dielectric layer having an opening section adjacent to the active layer within the first columnar section.

In a method for manufacturing a surface-emitting type semiconductor laser in accordance with an exemplary aspect of the present invention, the second columnar section can be formed with at least one aperture section provided within a region vertically above the dielectric layer.

In a method for manufacturing a surface-emitting type semiconductor laser in accordance with an exemplary aspect of the present invention, the dielectric layer can be formed by oxidizing a part of a layer composing the first columnar section.

The method for manufacturing a surface-emitting type semiconductor laser in accordance with an exemplary aspect of the present invention can further include forming at least another dielectric layer only in a region vertically above the dielectric layer within the second columnar section.

In a method for manufacturing a surface-emitting type semiconductor laser in accordance with an exemplary aspect of the present invention, forming the dielectric layer and forming the other dielectric layer can be conducted in a common process.

In a method for manufacturing a surface-emitting type semiconductor laser in accordance with an exemplary aspect of the present invention, the other dielectric layer can be formed by oxidizing a part of a layer composing the second columnar section.

DETAILED DESCRIPTION OF EXEMPLARY EMBODIMENTS

Exemplary embodiments of the present invention will be described below with reference to drawings.

1. First Exemplary Embodiment 1-1 Device Structure

Figure 1:
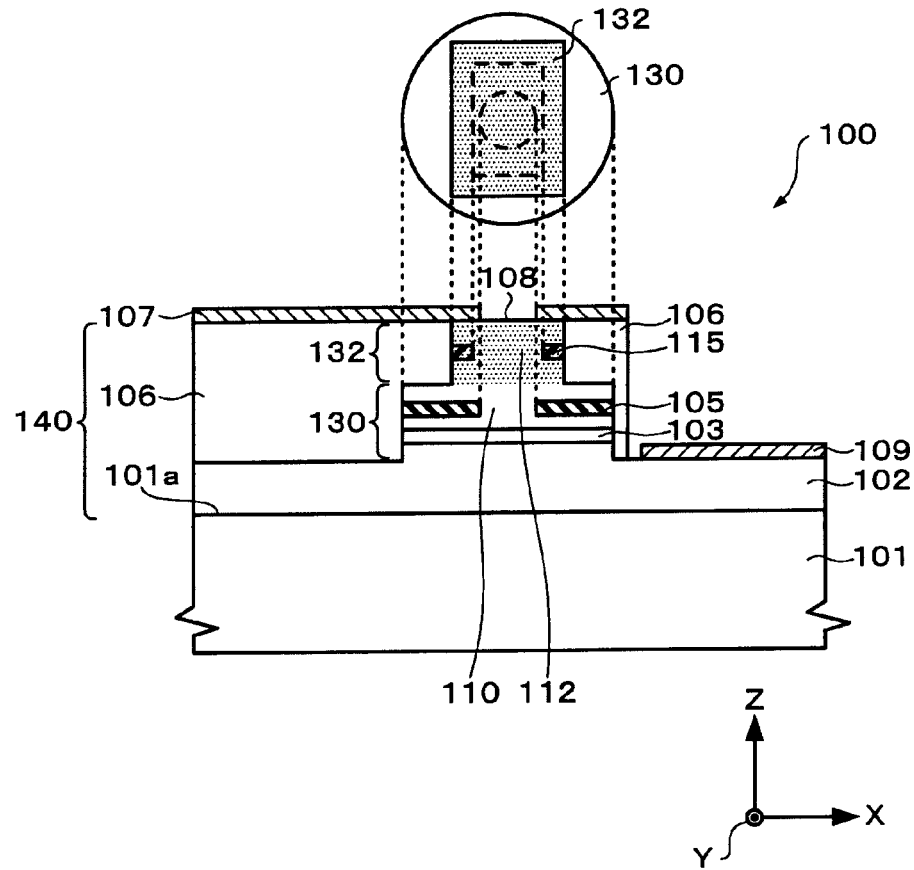
FIG. 1 is a schematic of a surface-emitting type semiconductor laser in accordance with an exemplary embodiment of the present invention shows a major portion of the surface-emitting type semiconductor laser.
Figure 2:
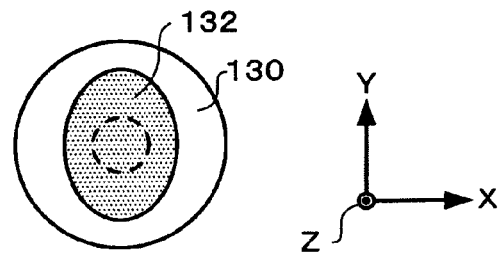
FIG. 2 is a schematic of portions of the surface-emitting type semiconductor laser of the present exemplary embodiment.
Figure 3:
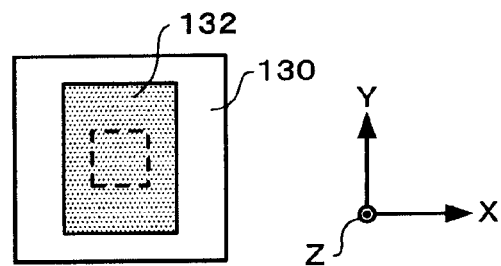
FIG. 3 is a schematic of portions of the surface-emitting type semiconductor laser of the present exemplary embodiment.
Figure 4:
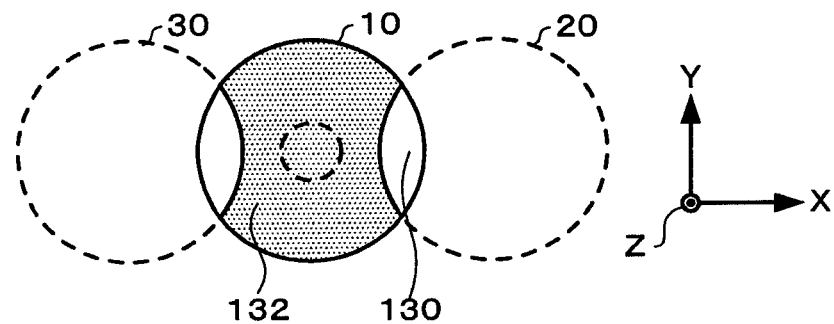
FIG. 4 is a schematic of portions of the surface-emitting type semiconductor laser of the present exemplary embodiment.

FIG. 1 is a schematic of a surface-emitting type semiconductor laser (hereinafter "surface emitting laser") 100 in accordance with a first exemplary embodiment of the present invention. FIG. 2-FIG. 4 are schematics of major portions of the surface-emitting laser 100 of the first exemplary embodiment.

The surface emitting laser 100 according to the first exemplary embodiment of the present invention includes a semiconductor substrate (a GaAs substrate in accordance with the present exemplary embodiment) 101, a vertical-cavity resonator 140 (hereinafter "resonator 140") formed on the semiconductor substrate 101, a first electrode 107 and a second electrode 109. The resonator 140 includes a first mirror 102, an active layer 103, and a second mirror 104.

Next, each of the compositions of the surface-emitting laser 100 will be described.

The resonator 140 may be formed, for example, from a first mirror 102 that is a distributed reflection type multilayer mirror of 40 pairs of alternately laminated n-type $Al_{0.9}Ga_{0.1}As$ layer and n-type $Al_{0.15}Ga_{0.85}As$ layer, an active layer 103 composed of GaAs well layers and $Al_{0.3}Ga_{0.7}As$ barrier layers in which the well layers include a quantum well structure composed of three layers, and a second mirror 104 that is a distributed reflection type multilayer mirror of 25 pairs of alternately laminated p-type $Al_{0.9}Ga_{0.1}As$ layer and p-type $Al_{0.15}Ga_{0.85}As$ layer, which are successively stacked in layers. It is noted that the composition of each of the layers and the number of the layers forming the first mirror 102, the active layer 103 and the second mirror 104 are not limited to the above.

The second mirror 104 may be formed to be p-type, for example, by doping C, Zn or Mg, and the first mirror 102 may be formed to be n-type, for example, by doping Si or Se. Accordingly, the second mirror 104, the active layer 103 in which no impurity is doped, and the first mirror 102 form a pin diode.

The second mirror 104 includes a part of a columnar first semiconductor deposited body (hereafter "first columnar section") 130 and a second semiconductor deposited body (hereafter "second columnar section") 132 located above the first columnar section 130. Side surfaces of the first columnar section 130 and the second columnar section 132 are covered with a dielectric layer 106.

The first columnar section 130 is formed to have a planar configuration that does not have anisotropy, when viewed from the laser light emission side. Assuming that axes intersecting at right angles through the center of an upper surface of the second mirror 104 and extending in parallel with the upper surface of the second mirror 104 are respectively an X-axis and a Y-axis, and an axis intersecting at right angles with the X-axis and Y-axis is a Z-axis, that the planar configuration of the first columnar section 130 does not have anisotropy means that the shape of a X-Z cross section and the shape of a Y-Z cross section of the first columnar section 130 are identical or generally identical with one another no matter which X-axis and Y-axis are selected. Specifically, there exists no X-axis and Y-axis that make the shape of a X-Z cross section and the shape of a Y-Z cross section of the first columnar section 130 different from one another. This similarly applies to exemplary embodiments to be described below. Specifically, the planar configuration that does not have anisotropy is, for example, a circular shape and a square shape. In the illustrated example, the planar configuration of the first columnar section 130 is formed to be circular.

A dielectric layer 105 (hereafter "first dielectric layer"), that functions as a current constricting layer, is formed in a region near the active layer 103 among layers composing the first columnar section 130. The first dielectric layer 105 has a cross section in a plane cut in parallel with the X-Y plane in FIG. 1, which is a ring shape extending along the circumference of the first columnar section 130. The first dielectric layer 105 has an opening section 110. For example, the first dielectric layer 105 may include aluminum oxide.

The second columnar section 132 is formed to have a planar configuration that has anisotropy, when viewed from the laser light emission side. Assuming that axes intersecting at right angles through the center of the upper surface of the second mirror 104 and extending in parallel with the upper surface of the second mirror 104 are respectively an X-axis and a Y-axis, and an axis intersecting at right angles with the X-axis and Y-axis is a Z-axis, that the planar configuration has anisotropy means that an X-axis and a Y-axis that make the shape of a X-Z cross section and the shape of a Y-Z cross section of the second columnar section 132 different from one another can be selected. Specifically, there exist an X-axis and a Y-axis that make the shape of a X-Z cross section and the shape of a Y-Z cross section of the second columnar section 132 different from one another. This similarly applies to exemplary embodiments to be described below. Specifically, the planar configuration that has anisotropy is, for example, an oval shape and a rectangular shape. In the illustrated example, the second columnar section 132 is formed to have a planar configuration that is rectangular.

The second columnar section 132 has a dielectric layer (hereafter "second dielectric layer") 115 along its circumference. The second dielectric layer 115 has a rectangular ring configuration that is concentric with the rectangular second columnar section 132 in a cross section in a plane cut in parallel with the X-Y plane in FIG. 1.

The second dielectric layer 115 is formed only in a region perpendicularly above the region where the first dielectric layer 105 is formed. The second dielectric layer 115 is formed so as not to exist perpendicularly above the opening section 110 of the first dielectric layer 105. As a result, the current density distribution near the active layer 103 is chiefly determined by the first dielectric layer 105 that functions as a current constricting layer, and the second dielectric layer 115 does not influence the current density distribution in an area adjacent to the active layer 103. The second dielectric layer 115 may include aluminum oxide, for example.

Any one of various combinations of the planar configuration of the first columnar section 130 and the planar configuration of the second columnar section 132 can be selected. For example, the following examples may be listed. As shown in FIG. 2, the planar configuration of the first columnar section 130 can be circular, and the planar configuration of the second columnar section 132 can be oval. As shown in FIG. 3, the planar configuration of the first columnar section 130 can be square, and the planar configuration of the second columnar section 132 can be rectangular. As shown in FIG. 4, the planar configuration of the first columnar section 130 can be circular, and the planar configuration of the second columnar section 132 can be in a shape generally corresponding to a first circle 10 excluding a portion overlapping with a second circle 20 and a portion overlapping with a third circle 30. The centers of the first circle 10, the second circle 20 and the third circle 30 can be linearly aligned.

In the surface-emitting laser 100 in accordance with the present exemplary embodiment, the dielectric layer 106 is formed to cover side surfaces of the second mirror 104, the active layer 103 and the first mirror 102, and the upper surface of the first mirror 102. For example, polyimide resin, fluorine resin, acrylic resin, epoxy resin, etc. can be used as the resin that composes dielectric layer 106. In particular, the resin may be polyimide resin or fluorine resin in view of their easiness of processing and nonconductivity.

A first electrode 107 is formed on the second columnar section 132 and the dielectric layer 106. Furthermore, a part where the first electrode 107 is not formed (an opening section) is provided in the central area of the upper surface of the second columnar section 132. This part defines an emission surface 108. This emission surface 108 defines an emission aperture of laser light. The first electrode 107 includes a multilayer film of Au and an alloy of Au and Zn, for example. Further, a second electrode 109 is formed on the upper surface of the first mirror 102. The second electrode 109 includes a multilayer film of Au and an alloy of Au of Ge, for example. In the surface-emitting laser 100 shown in FIG. 1, on the second columnar section 132, the first electrode 107 connects to the second mirror 104, and the second electrode 109 connects to the first mirror 102. An electric current is injected into the active layer 103 by these first electrode 107 and the second electrode 109.

The materials to form the first and second electrodes 107 and 109 are not limited to those described above, and, for instance, metals, such as Cr, Ti, Ni, Au or Pt and these alloys, etc. can be used depending on the requirements for adhesion enforcement, diffusion prevention or anti-oxidation, etc.

Figure 5:
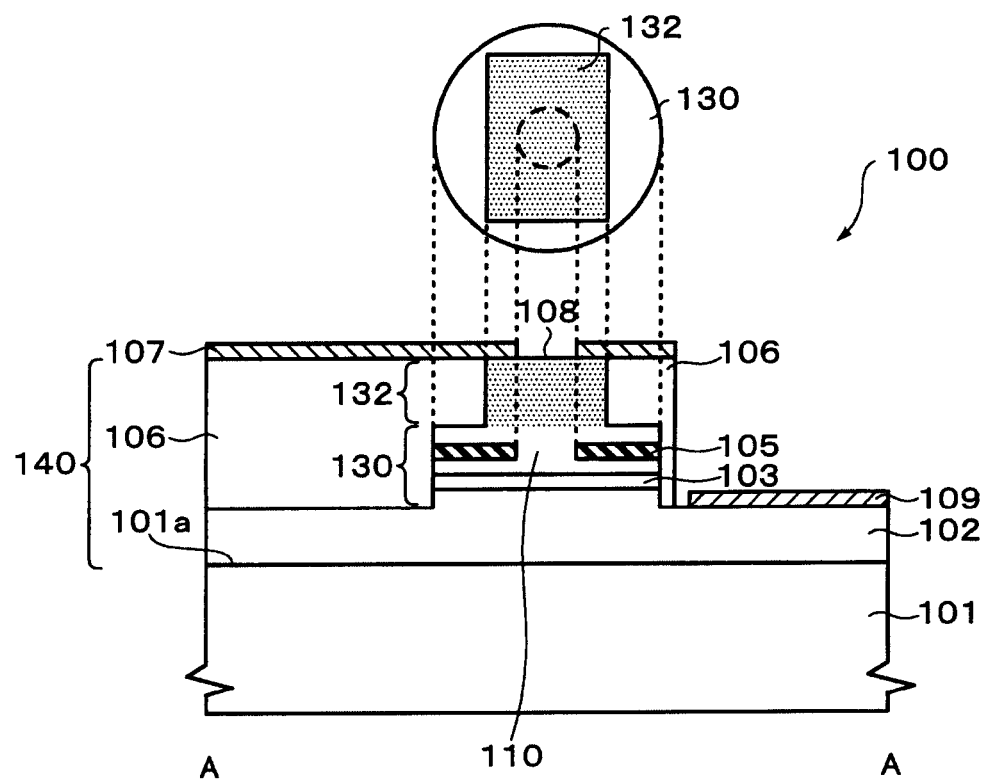
FIG. 5 is a schematic of a surface-emitting type semiconductor laser in accordance with an exemplary embodiment of the present invention showing a portion of the surface-emitting type semiconductor laser.
Figure 5:

In the example shown in FIG. 1, an example in which the second columnar section 132 includes the second dielectric layer 115 has been described. However, as shown in FIG. 5, the second columnar section 132 may be formed without having a second dielectric layer 115.

1-2 Operation of Device

General operations of the surface-emitting type semiconductor laser 100 of the present exemplary embodiment are described below. It is noted that the following method for driving the surface-emitting type semiconductor laser 100 is described as an example, and various changes can be made without departing from the subject matter of the present invention.

When applying a voltage in a forward direction to the pin diode across the first electrode 107 and the second electrode 109, recombination of electrons and holes occur in the active layer 103, thereby causing emission of light due to the recombination. Stimulated emission occurs during the period the generated light reciprocates between the second mirror 104 and the first mirror 102, so that the light intensity is amplified. When the optical gain exceeds the optical loss, laser oscillation occurs, so that laser light is emitted from the emission surface 108 that is present on the upper surface of the second columnar section 132 in a direction perpendicular (in the Z-direction indicated in FIG. 1) to the semiconductor substrate 101. It is noted here that the "direction perpendicular to the semiconductor substrate 101" corresponds to a direction perpendicular (Z-direction in FIG. 1) to a surface 101a (a plane parallel with the X-Y plane in FIG. 1) of the semiconductor substrate 101.

In the surface-emitting type semiconductor laser 100 of the present exemplary embodiment, the planar configuration of the second columnar section 132 has anisotropy. For this reason, optical confinement anisotropy can be obtained at the second columnar section 132. Polarization planes of the emitted laser light are aligned because of the optical confinement anisotropy. Because of the anisotropy of the planar configuration of the second columnar section 132, the laser light with its polarization direction controlled is emitted. Specifically, the polarization planes are aligned in the major axis direction. For example, in the example shown in FIG. 1, the polarization planes are aligned in the Y-direction.

Also, in the surface-emitting type semiconductor laser 100 of the present exemplary embodiment, the second columnar section 132 has the second dielectric layer 115, and the planar configuration of the second dielectric layer 115 has anisotropy. Therefore, anisotropy of a higher optical confinement can be obtained by the anisotropy of the planar configuration of the second dielectric layer 115 in addition to the anisotropy of an optical confinement obtained by the planar configuration of the second columnar section 132. Moreover, anisotropic strain is added at least to the second columnar section 132 by the second dielectric layer 115. Therefore, the laser light is emitted with its polarization direction more securely controlled, due to the optical confinement anisotropy and the anisotropic strain of the second dielectric layer 115, in addition to the optical confinement anisotropy given by the anisotropy of the planar configuration of the second columnar section 132.

Moreover, the surface-emitting type semiconductor laser 100 of the present exemplary embodiment is equipped with the first dielectric layer 105 that functions as a current constricting layer. When being driven, an electric current flows only to a portion where the current constricting layer is not formed (a portion that has not been oxidized), specifically, only to the opening section 110 of the first dielectric layer 105. Similarly, an electric current flows only to the opening section 112 of the second dielectric layer 15. Because the opening section 110 of the first dielectric layer 105 is narrower than the opening 112 of the second dielectric layer 115, the current density distribution in an area adjacent to the active layer 103 can be controlled by the size of the opening section 110 of the first dielectric layer 105.

1-3 Device Manufacturing Method

An example of a method of manufacturing the surface-emitting type semiconductor laser 100 according to the present exemplary embodiment will be described with reference to FIG. 6 to FIG. 13. FIG. 6 to FIG. 13 are schematics showing the method of manufacturing the surface-emitting type semiconductor laser 100 according to the present exemplary embodiment, each of which corresponds to the cross section indicated in FIG. 1.

Figure 6:
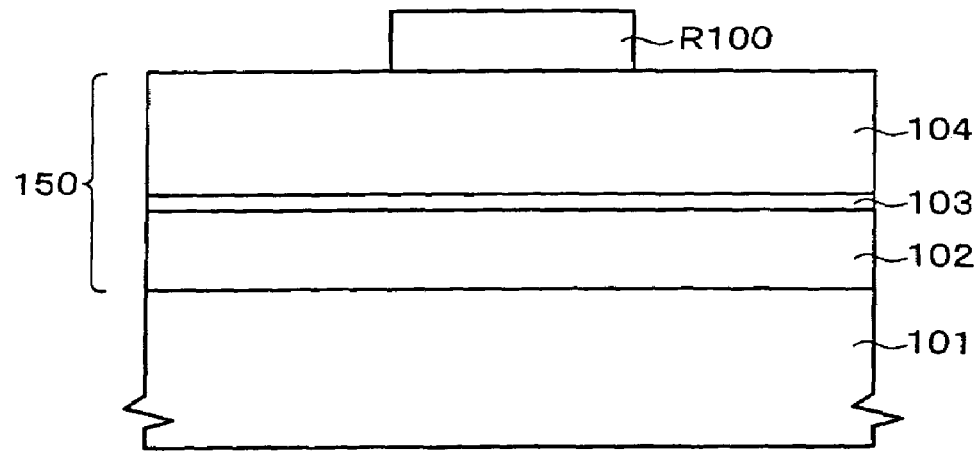
FIG. 6 is a schematic showing a method of manufacturing a surface-emitting type semiconductor laser in accordance with an exemplary embodiment of the present invention.

(1) First, on the surface of the semiconductor substrate 101 composed of n-type GaAs, a semiconductor multilayer film 150 shown in FIG. 6 is formed by epitaxial growth while modifying its composition. It is noted here that the semiconductor multilayer film 150 is formed from, for example, a first mirror 102 of 40 pairs of alternately laminated n-type $Al_{0.9}Ga_{0.1}As$ layers and n-type $Al_{0.15}Ga_{0.85}As$ layers, an active layer 103 composed of GaAs well layers and $Al_{0.3}Ga_{0.7}As$ barrier layers in which the well layers include a quantum well structure composed of three layers, and a second mirror 104 of 25 pairs of alternately laminated p-type $Al_{0.9}Ga_{0.1}As$ layers and p-type $Al_{0.15}Ga_{0.85}As$ layers. These layers are successively stacked in layers on the semiconductor substrate 101 to thereby form the semiconductor multilayer film 150.

When growing the second mirror 104, at least one layer thereof adjacent to the active layer 103 is formed as an AlAs layer or an AlGaAs layer that is later oxidized and becomes a first dielectric layer 105 (see FIG. 1). It is noted here that the position adjacent to the active layer 103 refers to a position above the active layer 103 and adjacent to the active layer 103, where the reliability of the active layer 103 would not be readily affected. For example, a position at about 100 nm-500 nm above the active layer 103.

Also, when growing the second mirror 104, at least one upper layer of the AlAs layers or AlGaAs layers that become the first dielectric layer 105 can be formed as an AlGaAs layer that is later oxidized and becomes a second dielectric layer 115 (see FIG. 1). The Al composition of the AlGaAs layer (hereafter "first AlGaAs layer") that becomes the first dielectric layer 105, and the Al composition of the AlGaAs layer (hereafter "second AlGaAs layer") that becomes the second dielectric layer 115 is 0.85 or higher, respectively, and these layers are grown such that the Al composition of the first AlGaAs layer is higher than the Al composition of the second AlGaAs layer. The reason for making the Al composition of the first AlGaAs layer higher than the Al composition of the second AlGaAs layer will be described below. It is noted that a layer with a high Al composition among layers that compose the second mirror 104 can be used as the second AlGaAs layer. For example, in the present exemplary embodiment example, among the 25 pairs of alternately laminated p-type $Al_{0.9}Ga_{0.1}As$ layers and p-type $Al_{0.15}Ga_{0.85}As$ layers, which compose the second mirror 104, a p-type $Al_{0.9}Ga_{0.1}As$ layer can be used. Also, the uppermost surface layer of the second mirror 104 may be formed with a high carrier density such that ohm contact can be readily made with an electrode (first electrode 107).

The temperature at which the epitaxial growth is conducted is appropriately decided depending on the growth method, the kind of raw material, the type of the semiconductor substrate 101, and the kind, thickness and carrier density of the semiconductor multilayer film 150 to be formed, and in general may be 450° C.-800° C. Also, the time required to conduct the epitaxial growth is appropriately decided like the temperature. Also, a metal-organic chemical vapor deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Figure 7:
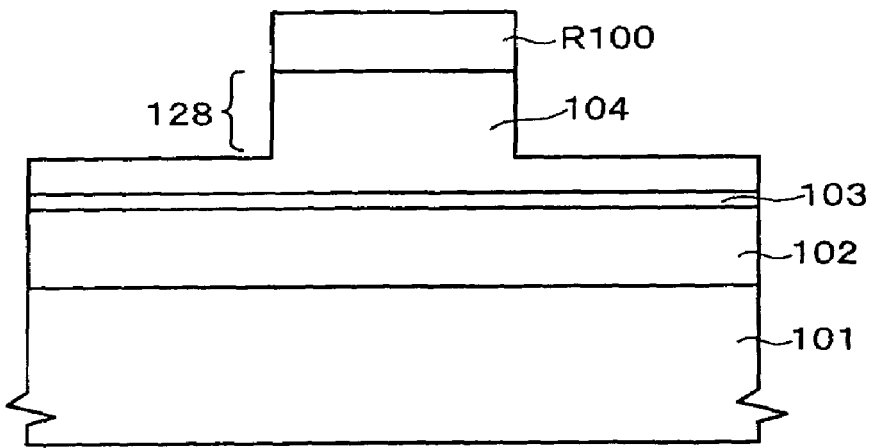
FIG. 7 is a schematic showing a method of manufacturing the surface-emitting type semiconductor laser in accordance with the present exemplary embodiment.

Then, resist is coated on the semiconductor multilayer film 150, and then the resist is patterned by a photolithography method, thereby forming a first mask layer R100 having a specified pattern, as shown in FIG. 6. The first mask layer R100 is formed above an area where a first columnar section 130 (see FIG. 1) is planned to be formed. The first mask layer R100 is formed in a manner that its planar configuration does not have anisotropy. As a result, the first columnar section 130 is formed such that its planar configuration does not have anisotropy. Next, by using the first mask layer R100 as a mask, a part of the second mirror 104 is etched by, for example, a dry etching method, thereby forming a pillar-shaped semiconductor deposited body (columnar section) 128, as shown in FIG. 7. Then, the first mask layer R100 is removed.

Figure 8:
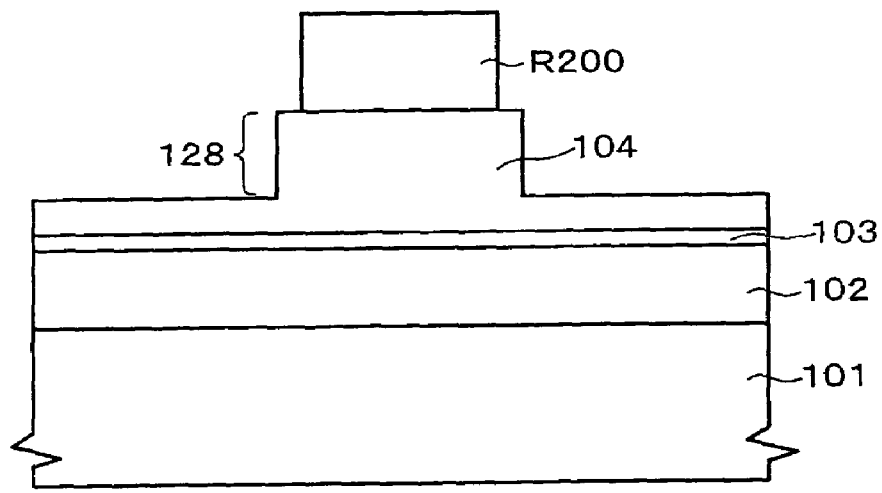
FIG. 8 is a schematic showing a method of manufacturing the surface-emitting type semiconductor laser in accordance with the present exemplary embodiment.

Next, a second mask layer R200 of a prescribed pattern is formed by a lithography method on the columnar section 128, as shown in FIG. 8.

Figure 9:
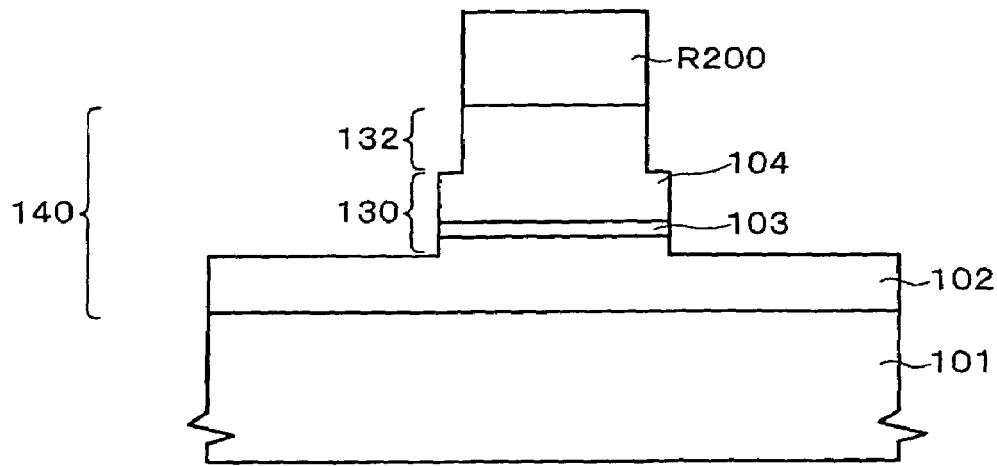
FIG. 9 is a schematic showing a method of manufacturing the surface-emitting type semiconductor laser in accordance with the present exemplary embodiment.

The second mask layer R200 is formed above an area where a second columnar section 132 (see FIG. 1) is planned to be formed. The second mask layer R200 is formed so that its planar configuration may have anisotropy. As a result, the second columnar section 132 can be formed so that its planar configuration has anisotropy. Next, by using the second mask layer R200 as a mask, the second mirror 104, the active layer 103, and a part of the first mirror 102 are etched by, for example, a dry etching method, so that the first columnar section 130 and the second columnar section 132 are formed, as shown in FIG. 9. Then, the second mask layer R200 is removed.

By the steps described above, a resonator 140 including the first columnar section 130 and the second columnar section 132 is formed on the semiconductor substrate 101, as shown in FIG. 9.

Figure 10:
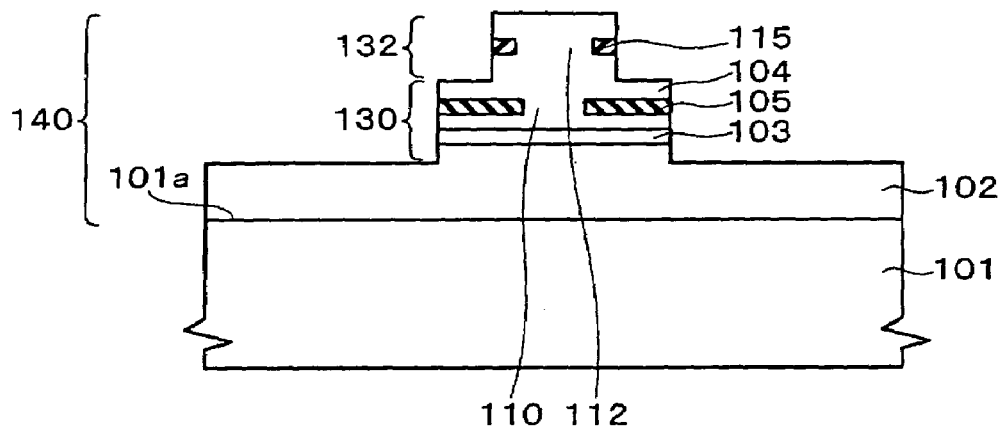
FIG. 10 is a schematic showing a method of manufacturing the surface-emitting type semiconductor laser in accordance with the present exemplary embodiment.

Next, by placing the semiconductor substrate 101 on which the resonator 140 is formed through the aforementioned steps in a water vapor atmosphere at about 400° C., for example, layers having a high Al composition (layers with an Al composition being 0.85 or higher) provided in the second mirror 104 are oxidized from their side surface, thereby forming the first dielectric layer 105 and the second dielectric layer 115 at the same time, as shown in FIG. 10. The first dielectric layer 105 and the second dielectric layer 115 can be formed by the same process. The oxidation rate depends on the temperature of the furnace, the amount of water vapor supply, and the Al composition and the film thickness of the layer to be oxidized.

Because the Al composition of the AlGaAs layer that becomes the first dielectric layer 105 (the first AlGaAs layer) is higher than the Al composition of the AlGaAs layer that becomes the second dielectric layer 115 (the second AlGaAs layer), the first AlGaAs layer is more readily oxidized than the second AlGaAs layer. As a result, the first dielectric layer 105 can be formed extending deeper toward the center of the second mirror 104, compared to the second dielectric layer 115. The opening section of the first dielectric layer 105 can be made narrower than the opening section of the second dielectric layer 115. By this, the electric current density adjacent to the active layer 103 can be mainly controlled by the first dielectric layer 105. Specifically, by controlling the range of the first dielectric layer 105 and the second dielectric layer 115 that are formed in the process of forming the first dielectric layer 105 and the second dielectric layer 115 by oxidation, the control of the current density adjacent to the active layer 103 becomes possible. The range of the second dielectric layer 115 does not influence the current density adjacent to the active layer 103.

By the steps described above, a portion that functions as a light emitting element (excluding an emission surface 108 and electrodes 107 and 109) in the surface-emitting laser 100 are formed.

(2) Next, a dielectric layer 106 that surrounds a part of the first mirror 102, the active layer 103 and the second mirror 104 is formed (see FIG. 1).

Here, an example in which polyimide resin is used as a material for forming the dielectric layer 106 will be described. First, a resin precursor (polyimide precursor) is coated on the resonator 140 by using, for example, a spin coat method, to thereby form a resin precursor layer. In this instance, the resin precursor layer is formed such that its film thickness is greater than the height of the second columnar section 132. As the method of coating the resin precursor, besides the aforementioned spin coat method, any suitable technique, such as, a dipping method, a spray coat method, an ink jet method or the like can be used.

Figure 11:
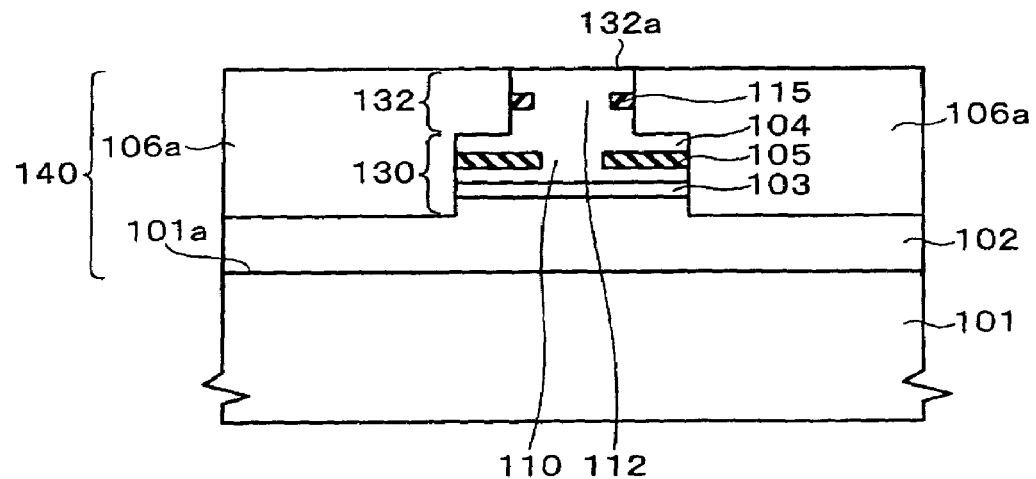
FIG. 11 is a schematic showing a method of manufacturing the surface-emitting type semiconductor laser in accordance with the present exemplary embodiment.
Figure 12:
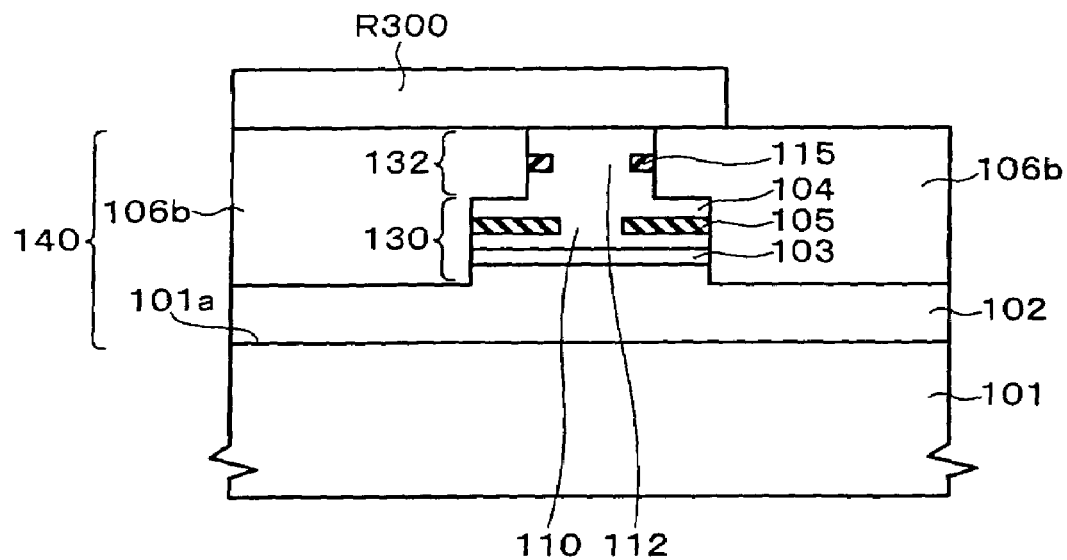
FIG. 12 is a schematic showing a method of manufacturing the surface-emitting type semiconductor laser in accordance with the present exemplary embodiment.

Then, the substrate is heated by using, for example, a hot plate or the like, thereby removing the solvent. Then as shown in FIG. 11, an upper surface 132a of the second columnar section 132 is exposed. As a method for exposing the upper surface 132a of the second columnar section 132, a CMP method, dry etching method, wet etching method or the like can be used after half-setting or almost completely setting a resin precursor layer 106a. When the resin precursor layer 106a is half set, a half-set resin layer 106b is formed, as shown in FIG. 12. Here, half-setting is to change the solubility to the etchant used for the wet etching in the succeeding step by applying energy rays, such as heat or light.

Figure 13:
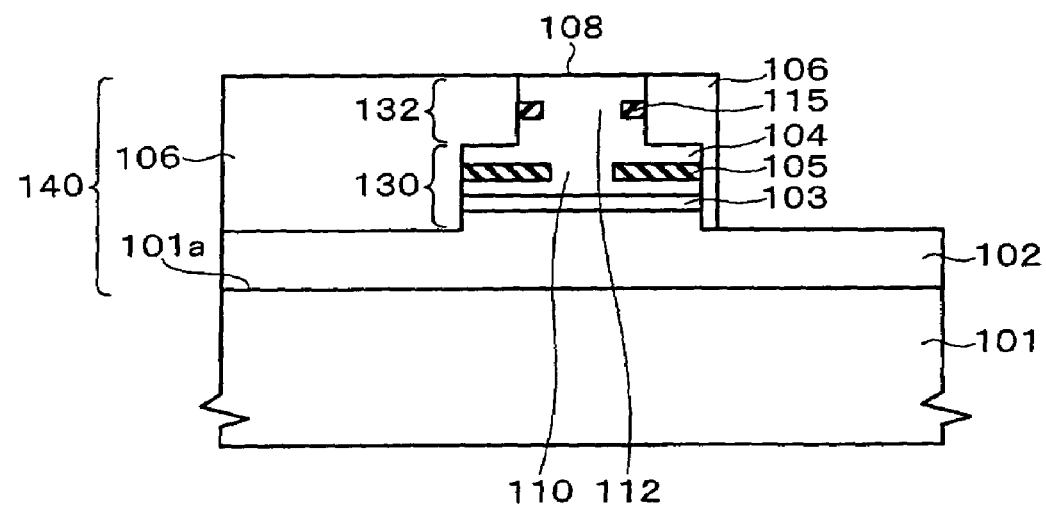
FIG. 13 is a schematic showing a method of manufacturing the surface-emitting type semiconductor laser in accordance with the present exemplary embodiment.

Then, the resin that is present to the side of the second mirror 104 is removed, to expose the first mirror 102 (see FIG. 13). As a method for removing the resin that is present to the side of the second mirror 104, (i) a method to remove the resin precursor layer 106b that is half set and is present to the side of the second mirror 104 by wet etching, and (ii) a method to remove the resin precursor layer 106b that is almost completely set and is present to the side of the second mirror 104 by wet etching can be used. In the present exemplary embodiment, an example that uses the aforementioned method (i) will be described.

In the aforementioned method (i), first, as shown in FIG. 12, a resist layer R300 is formed by a lithography method on regions of the half-set resin layer 106b and the second columnar section 132 other than the region where a second electrode 109 (see FIG. 1) is to be formed.

Next, by processing the semiconductor substrate 101, using a wet etching method, the half-set resin layer 106b formed to the side of the second mirror 104 is removed, and the first mirror 102 is exposed, as shown in FIG. 13. The exposed surface of the first mirror 102 may be etched if necessary. Then, the resist layer R300 is removed. Then, the semiconductor substrate 101 is placed in the furnace at about 350° C., for example, to thereby imidize the half-set resin layer 106b, so that a dielectric layer 106 that is almost completely set can be obtained.

Moreover, in the aforementioned method (i), if a dielectric layer 106 is formed with photosensitive resin, a resin precursor (in a non-exposed state), without forming a resist layer thereon, can be directly patterned by the same method used in patterning ordinary resist.

Although the method (i) is described above, a method to remove resin that is present to the side of the second mirror 104 is not limited to the method (i) described above, and for example, the method (ii) described above may be used instead.

(3) Next, the steps of forming a first electrode 107 and a second electrode 109 to inject an electric current into the active layer 103, and an emission surface 108 of laser light (see FIG. 1) will be described.

Prior to forming the first electrode 107 and the second electrode 109, exposed upper surfaces of the second columnar section 132 and the first mirror 102 may be washed by using a plasma treatment method, etc. if necessary. As a result, a device of more stable characteristics can be formed. Then, for example, a multilayer film of Au and an alloy of Au and Zn, is formed by, for example, a vacuum deposition method on the upper surface of the dielectric layer 106 and the second columnar section 132. Then a portion where the multilayer film is not formed is formed on the upper surface of the second columnar section 132 by a lift-off method. This portion becomes an emission surface 108. It is noted that, in the above step, a dry etching method or a wet etching method can be used instead of the lift-off method.

Also, a multilayer film of Au and an alloy of Au and Ge, for example, is formed by, for example, a vacuum deposition method on the upper surface where the first mirror 102 is exposed. Next, an annealing treatment is conducted. The temperature of the annealing treatment depends on the electrode material. This is usually conducted at about 400° C. for the electrode material used in the present exemplary embodiment. By the steps described above, the first electrode 107 and the second electrode 109 are formed.

By the process described above, the surface-emitting type semiconductor laser 100 shown in FIG. 1 can be obtained.

According to the example in the step (1) described above, when forming the second mirror 104, at least one layer above AlAs layers or AlGaAs layers (first AlGaAs layers) that become the first dielectric layer 105 is formed as an AlGaAs layer (second AlGaAs layer) that is later oxidized and becomes the second dielectric layer 115 (see FIG. 1). However, a surface-emitting type semiconductor laser 100 in which the second columnar section 132 does not include a second dielectric layer, as shown in FIG. 5, may be obtained by not forming the second AlGaAs layer.

1-4. Actions and Effects

Main actions and the effects of the surface-emitting type semiconductor laser 100 in accordance with the present exemplary embodiment are described below.

(1) The planar configuration of the first columnar section 130 and the first dielectric layer 105 that functions as a current constricting layer do not have anisotropy according to the surface-emitting type semiconductor laser 100 of the present exemplary embodiment. Therefore, the electric current flows almost uniformly in the first columnar section 130, and particularly in the neighborhood of the active layer 103. In the first columnar section 130 and the first dielectric layer 105, the current density distribution in the first columnar section 130 is not offset, and therefore the energy usage efficiency becomes higher, compared to the case in which the planar configuration of the first columnar section and the first dielectric layer has anisotropy.

Moreover, the planar configuration of the second columnar section 132 has anisotropy according to the surface-emitting type semiconductor laser 100 of the present exemplary embodiment. Therefore, the optical confinement anisotropy can be obtained in the second columnar section 132. The polarization direction of laser light that is emitted can be controlled by the anisotropy of the planar configuration of the second columnar section 132.

Therefore, according to the surface-emitting type semiconductor laser 100 of the present exemplary embodiment, the polarization direction of the laser light can be controlled while maintaining the energy usage efficiency.

(2) The second columnar section 132 can have the second dielectric layer 115 according to the surface-emitting type semiconductor laser 100 of the present exemplary embodiment. The planar configuration of this second dielectric layer 115 has anisotropy. Therefore, optical confinement anisotropy can further be obtained by the planar configuration of the second dielectric layer 115 in addition to the optical confinement anisotropy obtained by the planar configuration of the second columnar section 132. Moreover, because anisotropic strain is added at least to the second columnar section 132 by the second dielectric layer 115, the control of the polarization direction can be more readily controlled. The second dielectric layer 115 is formed at a position sufficiently far from the active layer 103, and therefore can achieve the above-mentioned actions and effects without affecting the reliability of the active layer 103.

2. Second Exemplary Embodiment 2-1 Device Structure

Figure 14:
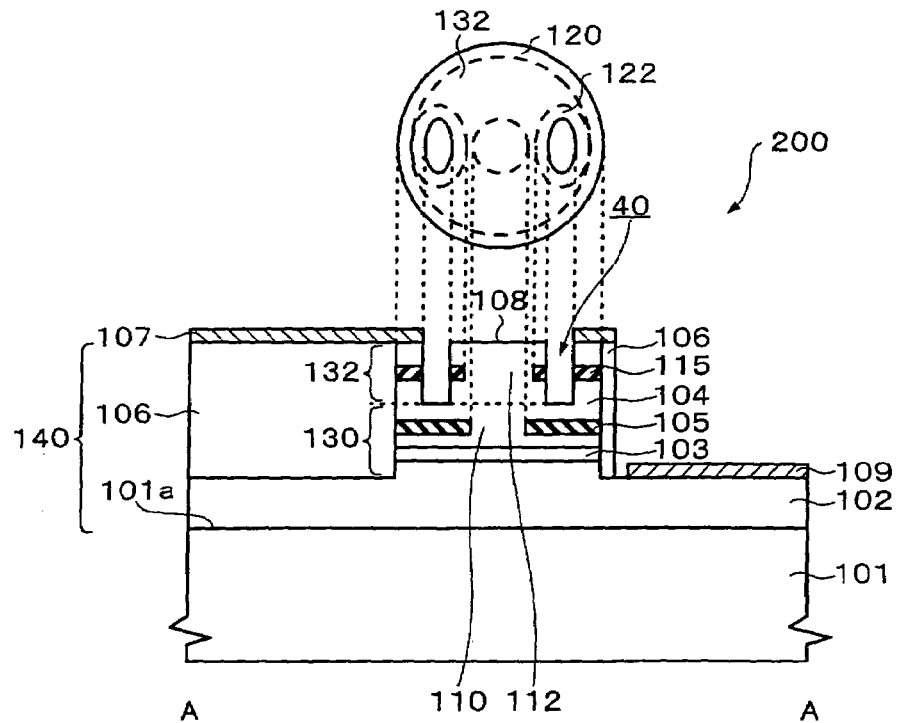
FIG. 14 is a schematic of a surface-emitting type semiconductor laser in accordance with an exemplary embodiment of the present invention showing a portion of the surface-emitting type semiconductor laser.
Figure 15:
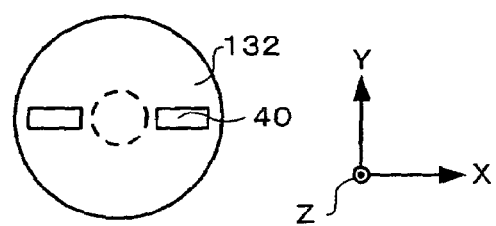
FIG. 15 is a schematic showing a major portion of a surface-emitting type semiconductor laser in accordance with an exemplary embodiment of the present invention.
Figure 16:
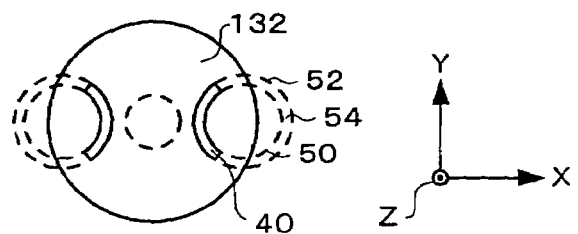
FIG. 16 is a schematic showing a major portion of a surface-emitting type semiconductor laser in accordance with an exemplary embodiment of the present invention.
Figure 17:
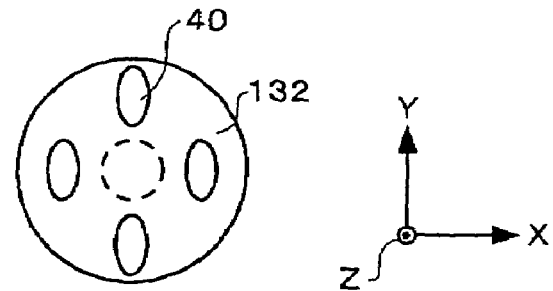
FIG. 17 is a schematic showing a major portion of a surface-emitting type semiconductor laser in accordance with an exemplary embodiment of the present invention.

FIG. 14 is a schematic of a surface emitting laser 200 in accordance with a second exemplary embodiment of the present invention. FIG. 15-FIG. 17 are schematics of major portions of the surface-emitting laser 200 in accordance with the second exemplary embodiment. The same reference numerals are appended to components that have substantially the same functions as those of the surface-emitting laser 100 in accordance with the first exemplary embodiment, and their detailed description is omitted.

As shown in FIG. 14, the surface-emitting laser 200 of the present exemplary embodiment includes a semiconductor substrate (a GaAs substrate in the present embodiment) 101, a resonator 140 formed on the semiconductor substrate 101, a first electrode 107, and a second electrode 109. The resonator 140 includes a first mirror 102, an active layer 103, and a second mirror 104.

The second mirror 104 includes a part of a first columnar section 130, and a second columnar section 132 located above the first columnar section 130. Side surfaces of the first columnar section 130 and the second columnar section 132 are covered by a dielectric layer 106.

The first columnar section 130 is formed to have a planar configuration that does not have anisotropy as viewed from the laser light emission side. In the illustrated example, the planar configuration of the first columnar section 130 is formed in a circular shape.

A first dielectric layer 105 that functions as a current constriction layer is formed in a region in layers composing the first columnar section 130 near the active layer 103. The first dielectric layer 105 has a cross section in a ring shape in a plane cut in parallel with the X-Y plane in FIG. 14.

The second columnar section 132 is formed to have a planar configuration that has anisotropy as viewed from the laser beam emission side. The second columnar section 132 has two aperture sections 40 that are origin-symmetrical in the direction of the X axis, as shown in FIG. 14. The planar configuration of each of the apertures 40 has anisotropy. Assuming that axes intersecting at right angles through the center of a bottom surface of the aperture section 40 and extending in parallel with the bottom surface of the aperture section 40 are respectively an X-axis and a Y-axis, and an axis intersecting at right angles with the X-axis and Y-axis is a Z-axis, that the planar configuration has anisotropy means that an X-axis and a Y-axis that make the shape of a X-Z cross section and the shape of a Y-Z cross section of the aperture section 40 different from one another can be selected. There exists an X-axis and a Y-axis that make the shape of a X-Z cross section and the shape of a Y-Z cross section of the aperture section 40 different from one another.

Specifically, for example as shown in FIG. 14, the planar configuration of the aperture section 40 may be oval. The aperture section 40 may have the following planar configurations. As shown in FIG. 15, the aperture section 40 may have a planar configuration that is rectangular. As shown in FIG. 16, the aperture section 40 may have a planar configuration corresponding to a cut section of a ring section 54 formed by two concentric circles 50 and 52.

Also, in the example described above with reference to FIG. 14, the planar configuration of the aperture section 40 has anisotropy. But the aperture section 40 can have a planar configuration that does not have anisotropy. Assuming that axes intersecting at right angles through the center of a bottom surface of the aperture section 40 and extending in parallel with the bottom surface of the aperture section 40 are respectively an X-axis and a Y-axis, and an axis intersecting at right angles with the X-axis and Y-axis is a Z-axis, that the planar configuration does not have anisotropy means that the shape of a X-Z cross section and the shape of a Y-Z cross section of the aperture section 40 become identical or almost identical with one another whatever X-axis and Y-axis are selected. There exists no X-axis and Y-axis that make the shape of a X-Z cross section and the shape of a Y-Z cross section of the aperture section 40 different from one another. Specifically, the aperture section 40 may have a planar configuration that is, for example, circle or square.

The position of the aperture sections 40 is not limited to the X-axis direction, and may not be particularly limited as long as they are located in a region vertically above the first dielectric layer 105, and the planar configuration of the second columnar section 132 has anisotropy. For example, the aperture sections 40 can be located in the X-axis direction and in the Y-axis direction, as shown in FIG. 17. That is, the aperture sections 40 are located in the region vertically above the first dielectric layer 105. The aperture sections 40 do not exist in the region vertically above the opening section 110 of the first dielectric layer 105. By this, it is possible to reduce the likelihood or prevent the laser emission efficiency from being decreased, and to make only a specific radiation mode influenced by the aperture sections 40. At least one aperture section 40 or more can be formed. In the illustrated example, the aperture sections 40 penetrate the second columnar section 132, but they can be provided without penetrating the same.

The aperture sections 40 can be embedded with a material that has a thermal expansion coefficient different from that of the material that composes the second mirror 104. Materials having a different thermal expansion coefficient may be, for example, polyimide resin, fluorine resin, acrylic resin, epoxy resin, metal and the like. By embedding with a material having a high thermal expansion coefficient, such as metal, the heat radiation of the second columnar section 132 can be enhanced.

The second columnar section 132 can have a second dielectric layer 115 along its circumference and along a circumference of each of the aperture sections 40. The second dielectric layer 115 has a ring shaped section 120 in a circular shape that is concentric with the second columnar section 132, and ring shaped sections 122 that are oval and formed around the aperture sections 40, in a cross section cut in a plane parallel with an X-Y plane in FIG. 14. The second dielectric layer 115 is formed only in a region vertically above the region where the first dielectric layer 105 is formed, like the first exemplary embodiment.

In the example shown in FIG. 14, the planar configuration of the first columnar section 130 is circular, the planar configuration of the external configuration of the second columnar section 132 is also circular. However, the combination of the planar configuration of the first columnar section 130 and the planar configuration of the external configuration of the second columnar section 132 can be selected from various combinations. The external configuration of the second columnar section 132 is the configuration of the second columnar section 132 when assuming that the second columnar section 132 does not have the aperture section 40. The combination of the planar configuration of the first columnar section 130 and the planar configuration of the external configuration of the second columnar section 132 includes the case where neither the planar configuration of the first columnar section 130 or the planar configuration of the external configuration of the second columnar section 132 has anisotropy. Specifically, for example, the planar configuration of the first columnar section 130 and the planar configuration of the external configuration of the second columnar section 132 are both circular (see FIG. 14) or square. Alternatively, the case where the planar configuration of the first columnar section 130 does not have anisotropy, and the planar configuration of the external configuration of the second columnar section 132 has anisotropy is included. Specifically, for example, the planar configuration of the first columnar section 130 may be circular or square, and the planar configuration of the external configuration of the second columnar section 132 may be oval or rectangular.

In the surface-emitting laser 200 in accordance with the present exemplary embodiment, the dielectric layer 106 is formed to cover the side surface of the second mirror 104 and the active layer 103 and the upper surface of the first mirror 102.

A first electrode 107 is formed over the second columnar section 132 and the dielectric layer 106. In addition, a part where the first electrode 107 is not formed (opening section) is provided in the center of the upper surface of the second columnar section 132. This part is an emission surface 108. This emission surface 108 defines an emission aperture of the laser light. Furthermore, a second electrode 109 is formed on the upper surface of the first mirror 102.

It is noted that, in the example in accordance with the present exemplary embodiment described above, the second columnar section 132 has the second dielectric layer 115. But the second columnar section 132 can be provided without the second dielectric layer 115.

General operations of the surface-emitting type semiconductor laser 200 of the present exemplary embodiment are described below. It is noted that a method of driving the surface-emitting type semiconductor laser 200 described below is an example, and various changes can be made without departing from the subject matter of the present invention. Detailed descriptions of operations thereof that are substantially the same as those of the first exemplary embodiment are omitted.

In the surface-emitting type semiconductor laser 200 of the present exemplary embodiment, the second columnar section 132 has the aperture sections 40 and anisotropy. For this reason, anisotropic strain and optical confinement anisotropy can be obtained at the second columnar section 132. Polarization planes of the emitted laser light are aligned because of the anisotropic strain and optical confinement anisotropy. Because the second columnar section 132 has the aperture sections 40, the laser light is emitted with its polarization direction controlled. Specifically, the polarization planes are aligned in a direction where the aperture sections 40 do not exist; for instance, in the example shown in FIG. 14, the polarization planes are aligned in the Y-direction.

Also, in the surface-emitting type semiconductor laser 200 of the present exemplary embodiment, the aperture sections 40 can be embedded with a material that has a thermal expansion coefficient different from that of the material that composes the second mirror 104. For this reason, in addition to the anisotropic strain and optical confinement anisotropy caused by the aperture sections 40 of the second columnar section 132, further anisotropic strain can be obtained by the material having a different thermal expansion coefficient embedded in the aperture sections 40. As a result, the laser light is emitted with its polarization direction more securely controlled.

2-3 Device Manufacturing Process

An example of a method for manufacturing the surface-emitting type semiconductor laser 200 according to the second exemplary embodiment of the present invention will be described with reference to FIG. 6, FIG. 7 and FIG. 18 to FIG. 23. FIG. 6, FIG. 7 and FIG. 18 to FIG. 23 are schematics showing the method of manufacturing the surface-emitting type semiconductor laser 200 according to the present exemplary embodiment shown in FIG. 14, each of which corresponds to the cross section indicated in FIG. 14. Detailed descriptions of the steps that are substantially the same as those of the first exemplary embodiment are omitted.

(1) First, on the surface of the semiconductor substrate 101 composed of n-type GaAs, a semiconductor multilayer film 150 shown in FIG. 6 is formed by epitaxial growth while modifying its composition. It is noted here that the semiconductor multilayer film 150 is formed from a first mirror 102, an active layer 103, and a second mirror 104.

When growing the second mirror 104, at least one layer thereof adjacent to the active layer 103 is formed as an AlAs layer or an AlGaAs layer that is later oxidized and becomes a first dielectric layer 105. It is noted here that the position adjacent to the active layer 103 refers to a position above the active layer 103 and adjacent to the active layer 103, where the reliability of the active layer 103 would not be readily affected. For example, a position at about 100 nm-500 nm above the active layer 103.

Also, when growing the second mirror 104, at least one upper layer of AlAs layers or AlGaAs layers that become the first dielectric layer 105 can be formed as an AlGaAs layer that is later oxidized and becomes a second dielectric layer 115. The Al composition of the AlGaAs layer (first AlGaAs layer) that becomes the first dielectric layer 105, and the Al composition of the AlGaAs layer (second AlGaAs layer) that becomes the second dielectric layer 115, is 0.85 or higher, respectively. These layers are grown such that the Al composition of the first AlGaAs layer is higher than the Al composition of the second AlGaAs layer. The reason for making the Al composition of the first AlGaAs layer higher than the Al composition of the second AlGaAs layer is the same as the reason described in conjunction with the first exemplary embodiment.

Then, resist is coated on the semiconductor multilayer film 150. Then the resist is patterned by a photolithography method, thereby forming a first mask layer R100 having a specified pattern, as shown in FIG. 6. The first mask layer R100 is formed above an area where a first columnar section 130 (see FIG. 14) is planned to be formed. The first mask layer R100 is formed in a manner that its planar configuration does not have anisotropy. As a result, the first columnar section 130 is formed such that its planar configuration does not have anisotropy. Next, by using the first mask layer R100 as a mask, a part of the second mirror 104 is etched by, for example, a dry etching method, thereby forming a pillar-shaped semiconductor deposited body (columnar section) 128, as shown in FIG. 7. Then, the first mask layer R100 is removed.

Figure 18:
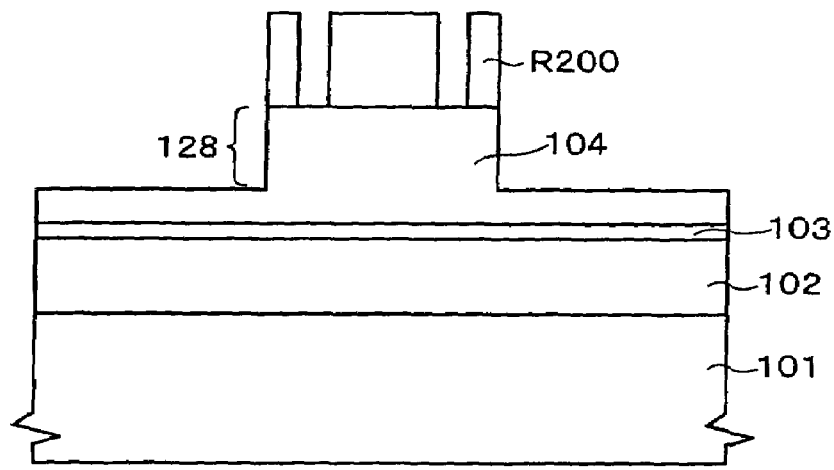
FIG. 18 is a schematic showing a method of manufacturing a surface-emitting type semiconductor laser in accordance with an exemplary embodiment of the present invention.
Figure 19:
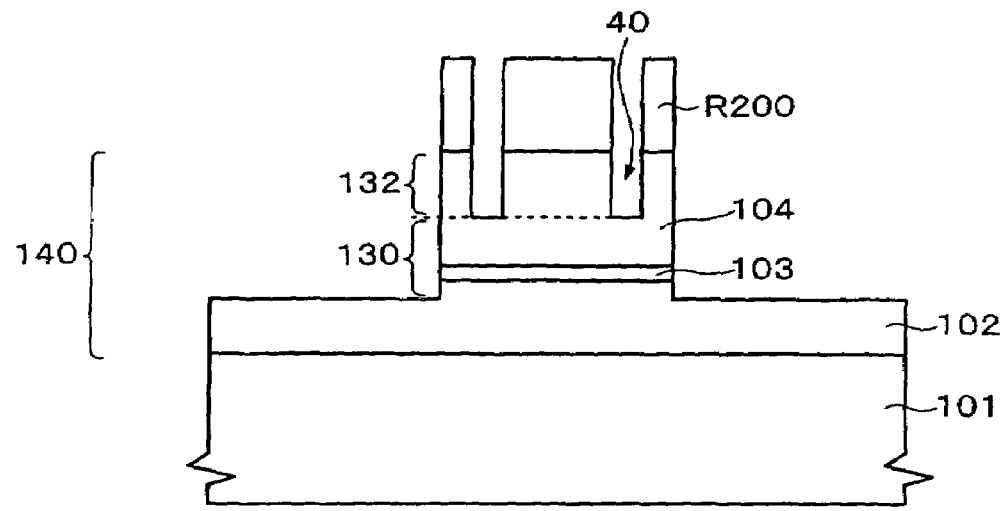
FIG. 19 is a schematic showing a method of manufacturing the surface-emitting type semiconductor laser in accordance with the present exemplary embodiment.

Next, a second mask layer R200 having a prescribed pattern is formed by a lithography method on the columnar section 128, as shown in FIG. 18. The second mask layer R200 is formed above an area where aperture sections 40 of a second columnar section 132 (see FIG. 14) are planned to be formed. The second mask layer R200 is formed so that its planar configuration may have anisotropy. As a result, the second columnar section 132 can be formed so that its planar configuration has anisotropy. Next, by using the second mask layer R200 as a mask, the second mirror 104, the active layer 103, and a part of the first mirror 102 are etched by, for example, a dry etching method, so that the first columnar section 130 and the second columnar section 132 are formed, as shown in FIG. 19. Then, the second mask layer R200 is removed.

By the steps described above, a resonator 140 including the first columnar section 130 and the second columnar section 132 is formed on the semiconductor substrate 101.

Figure 20:
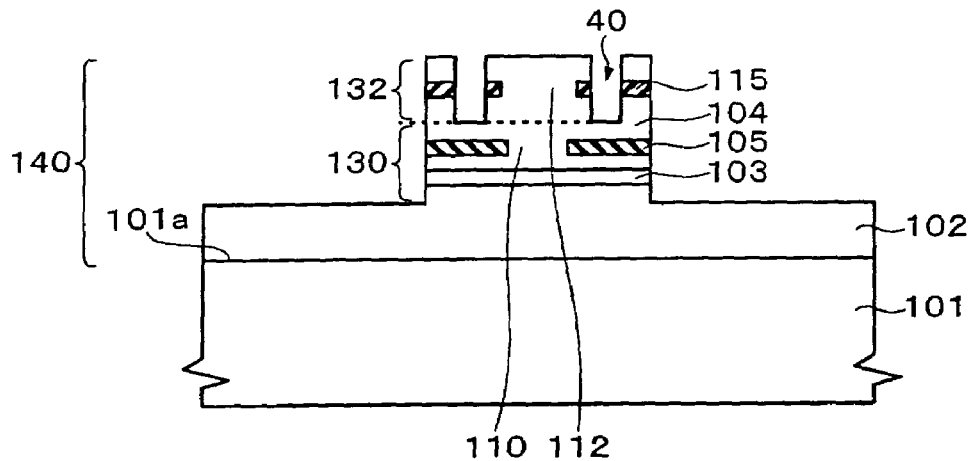
FIG. 20 is a schematic showing a method of manufacturing the surface-emitting type semiconductor laser in accordance with the present exemplary embodiment.

Next, by placing the semiconductor substrate 101 on which the resonator 140 is formed through the aforementioned steps in a water vapor atmosphere at about 400° C., for example, layers having a high Al composition provided in the second mirror 104 are oxidized from their side surface, thereby forming the first dielectric layer 105 and the second dielectric layer 115 at the same time, as shown in FIG. 20. The first dielectric layer 105 and the second dielectric layer 115 can be formed by the same process. The oxidation rate depends on the temperature of the furnace, the amount of water vapor supply, and the Al composition and the film thickness of the layer to be oxidized.

By the steps described above, a portion that functions as a light emitting element (excluding an emission surface 108 and electrodes 107 and 109) in the surface-emitting laser 200 are formed.

(2) Next, a dielectric layer 106 that surrounds a part of the first mirror 102, the active layer 103 and the second mirror 104 is formed (see FIG. 14).

It is noted here that an example in which polyimide resin is used as a material to form the dielectric layer 106 will be described. First, a resin precursor (polyimide precursor) is coated on the resonator 140 by using, for example, a spin coat method, to thereby form a resin precursor layer. In this instance, the aperture sections 40 can be embedded with the resin precursor. Alternatively, the aperture sections 40 may not be embedded with the resin precursor.

Figure 21:
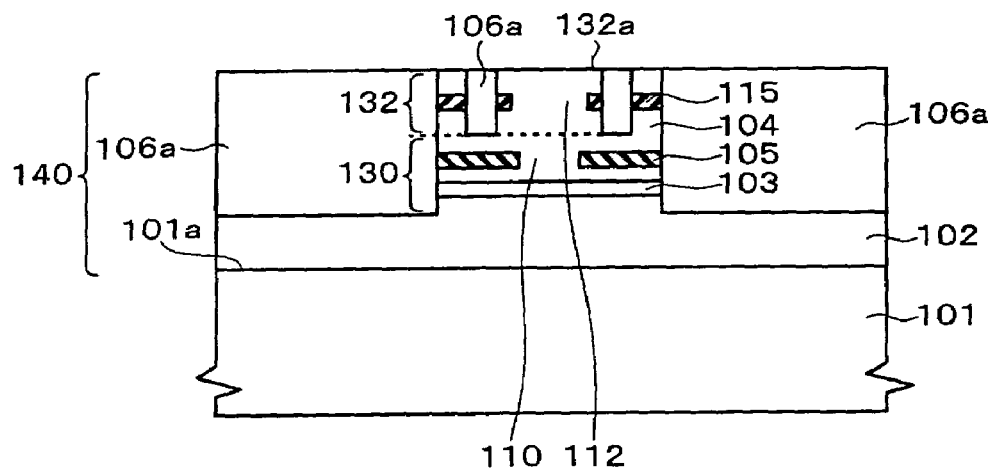
FIG. 21 is a schematic showing a method of manufacturing the surface-emitting type semiconductor laser in accordance with the present exemplary embodiment.

Then, the substrate is heated by using, for example, a hot plate or the like, to remove the solvent, and then as shown in FIG. 21, an upper surface 132a of the second columnar section 132 is exposed.

Figure 22:
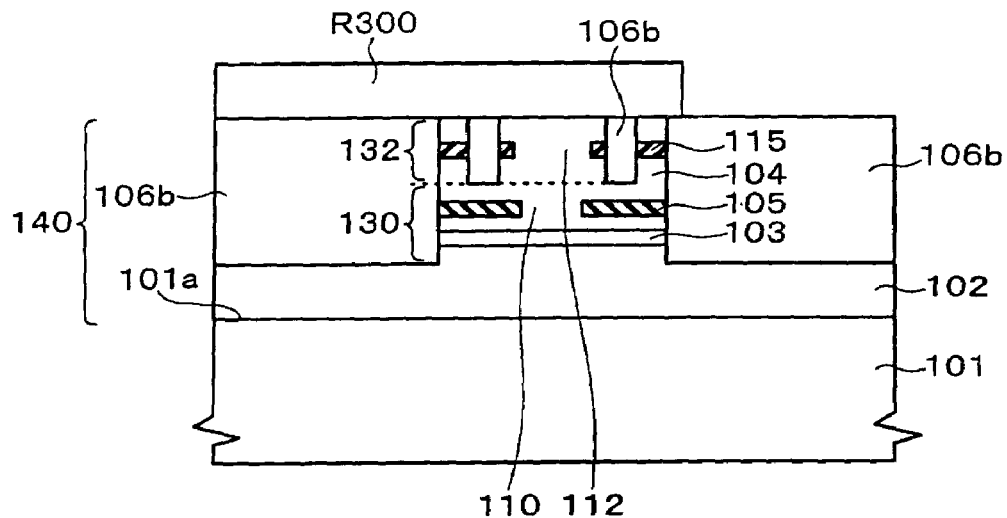
FIG. 22 is a schematic showing a method of manufacturing the surface-emitting type semiconductor laser in accordance with the present exemplary embodiment.
Figure 23:
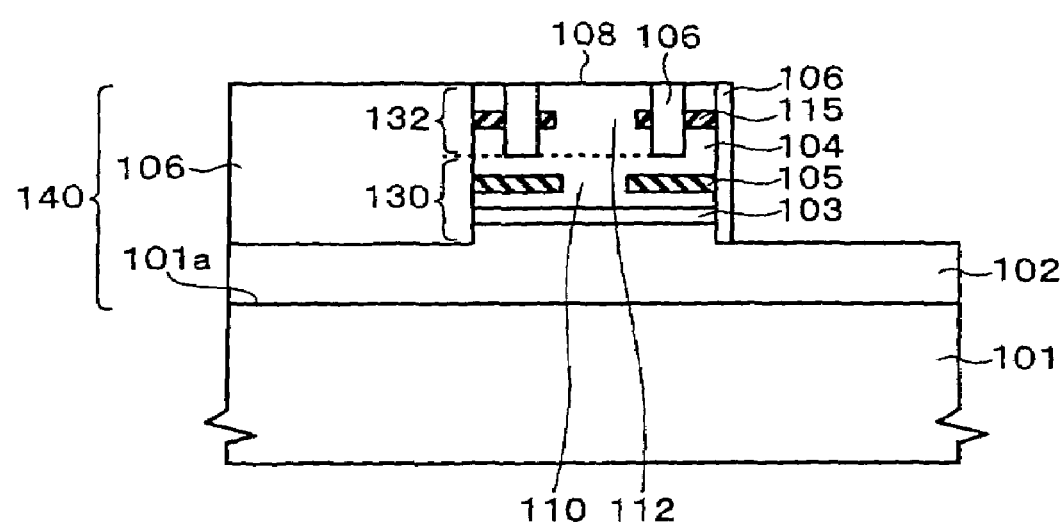
FIG. 23 is a schematic showing a method of manufacturing the surface-emitting type semiconductor laser in accordance with the present exemplary embodiment.

Then, the resin that is present to the side of the second mirror 104 is removed, thereby exposing the first mirror 102 (see FIG. 23). As a method for removing the resin that is present to the side of the second mirror 104, as shown in FIG. 22, the resin precursor layer 106a is half-set, thereby forming a half-set resin layer 106b. Next, a resist layer R300 is formed by a lithography method on regions of the half-set resin layer 106b and the second columnar section 132 other than the region where a second electrode 109 is to be formed below.

Next, by processing the semiconductor substrate 101, using a wet etching method, the half-set resin layer 106b formed to the side of the second mirror 104 is removed, and the first mirror 102 is exposed, as shown in FIG. 23. Then, the resist layer R300 is removed. Then, the semiconductor substrate 101 is placed in the furnace at about 350° C., for example, to thereby imidize the half-set resin layer 106b, so that a dielectric layer 106 that is almost completely hardened can be obtained. It is noted that, in the illustrated exemplary embodiment, an example in which the same material as that of the dielectric layer 106 is embedded in the aperture sections 40 is described. However, a material different from that of the dielectric layer 106 can be embedded in the aperture sections 40.

(3) Next, the steps of forming a first electrode 107 and a second electrode 109 to inject an electric current into the active layer 103, and an emission surface 108 of laser light (see FIG. 14) will be described.

First, for example, a multilayer film of Au and an alloy of Au and Zn, is formed by, for example, a vacuum deposition method on the upper surface of the dielectric layer 106 and the second columnar section 132. Then, a portion where the multilayer film is not formed is formed on the upper surface of the second columnar section 132 by a lift-off method. This portion defines an emission surface 108.

Also, a multilayer film of Au and an alloy of Au and Ge, for example, is formed by, for example, a vacuum deposition method on an exposed upper surface of the first mirror 102. Next, an annealing treatment is conducted. The temperature of the annealing treatment depends on the electrode material. By the steps described above, the first electrode 107 and the second electrode 109 are formed.

By the process described above, the surface-emitting type semiconductor laser 200 shown in FIG. 14 can be obtained.

2-4 Actions and Effects

Main actions and the effects of the surface-emitting type semiconductor laser 200 in accordance with the present exemplary embodiment are described below.

(1) The planar configuration of the first columnar section 130 and the first dielectric layer 105 that functions as a current constricting layer do not have anisotropy according to the surface-emitting type semiconductor laser 200 of the present exemplary embodiment. Therefore, the electric current flows almost uniformly in the first columnar section 130, and particularly in the neighborhood of the active layer 103. In the first columnar section 130 and the first dielectric layer 105, the current density distribution in the first columnar section 130 is not offset. Therefore the energy usage efficiency becomes higher, compared to the case in which the planar configuration of the first columnar section and the first dielectric layer has anisotropy Moreover, the planar configuration of the second columnar section 132 has anisotropy according to the surface-emitting type semiconductor laser 200 of the present exemplary embodiment. Specifically, the second columnar section 132 has the aperture sections 40. For this reason, anisotropic strain and optical confinement anisotropy can be obtained in the second columnar section 132. Accordingly, the polarization direction of laser light to be emitted can be controlled by the second columnar section 132.

Therefore, according to the surface-emitting type semiconductor laser 200 of the present exemplary embodiment, the polarization direction of the laser light can be controlled while maintaining the energy usage efficiency.

(2) The second columnar section 132 can have the second dielectric layer 115, according to the surface-emitting type semiconductor laser 200 of the present exemplary embodiment. Therefore, anisotropic strain is added at least to the second columnar section 132 by the second dielectric layer 115, such that the polarization direction can be more readily controlled. Also, the planar configuration of the second dielectric layer 115 can have anisotropy. For this reason, optical confinement anisotropy can further be obtained by the planar configuration of the second dielectric layer 115 in addition to the optical confinement anisotropy obtained by the planar configuration of the second columnar section 132. The second dielectric layer 115 is formed at a position sufficiently far from the active layer 103, and therefore can achieve the above-mentioned actions and effects without affecting the reliability of the active layer 103.

(3) In accordance with the surface-emitting type semiconductor laser 200 of the present exemplary embodiment, due to the fact that the aperture sections 40 of the second columnar section 132 are located in the region vertically above the first dielectric layer 105, specifically, the aperture sections 40 do not exist above the opening section of the first dielectric layer 105, it is possible to reduce the likelihood or prevent the laser emission efficiency from being decreased, and to make only a specific radiation mode influenced by the aperture sections 40.

Although the examples of the exemplary embodiments of the present invention have been describe above, the present invention is not limited to them, and many modifications can be made within the scope of the subject matter thereof. For example, in the exemplary embodiments of the present invention described above, one example in which the planar configuration of the first columnar section 130 does not have anisotropy was described. However, the planar configuration of the first columnar section 130 can have anisotropy. By providing the first columnar section 130 with an anisotropic planar configuration, the control of polarized planes becomes easier. In this instance, the degree of anisotropy of the first columnar section 130 is set to be lower than that of the second columnar section 132. Here, the degree of anisotropy is a degree of effect attained in controlling the plane of polarization by optical confinement anisotropy or anisotropic strain.

Due to the fact that the degree of anisotropy of the first columnar section 130 is lower than that of the second columnar section 132, the polarization direction of the laser light can be controlled while maintaining the energy usage efficiency.

Also, in the exemplary embodiments of the present invention, for instance, an example in which the second mirror 104 has the first dielectric layer 105 is described. However, the first mirror 102 can have a first dielectric layer 105.

Moreover, in the exemplary embodiments of the present invention, for instance, an example in which the first columnar section 130 includes the first mirror 102 and the active layer 103 is described. However, it is possible for the first columnar section 130 not to include the first mirror 102. Also, it is possible for the first columnar section 130 not to include the first mirror 102 or the active layer 103. In this case, the second mirror 104 includes the entirety of the first columnar section 130.

What is claimed is:

1. A surface-emitting type semiconductor laser, comprising:
    a substrate;
    a first mirror disposed above the substrate;
    an active layer disposed above the first mirror;
    a second mirror disposed above the active layer;
    a first columnar section including the active layer, the first columnar section not having anisotropy;
    a first dielectric layer disposed in the first columnar section, the first dielectric layer including a symmetric opening section;
    a second columnar section disposed above the first columnar section, the second columnar section having an outer wall that has anisotropy; and
    a second dielectric layer disposed in the second columnar section, the second dielectric layer including an asymmetric opening section.

2. The surface-emitting type semiconductor laser according to claim 1, the asymmetric opening section being disposed centered symmetrically about the symmetric opening section of the first dielectric layer.

3. The surface-emitting type semiconductor laser according to claim 1, the asymmetric opening section being embedded with a material having a coefficient of thermal expansion different from a coefficient of thermal expansion of a material composing the second mirror.

4. The surface-emitting type semiconductor laser according to claim 1, the second dielectric layer being only in a region vertically above the first dielectric layer.

5. The surface-emitting type semiconductor laser according to claim 4, the second dielectric layer being formed in a ring shape along a circumference of the second columnar section.

6. The surface-emitting type semiconductor laser according to claim 4, the first dielectric layer and the second dielectric layer being formed by oxidizing AlGaAs layers from side surfaces thereof.

7. The surface-emitting type semiconductor laser according to claim 6, an Al composition of the AlGaAs layer forming the first dielectric layer being higher than an Al composition of the AlGaAs layer forming the second dielectric layer.

8. The surface-emitting type semiconductor laser according to claim 1, the first columnar section having a circular shape or a square shape, and the outer wall of the second columnar section having an oval shape or a rectangular shape.

* * * * *